(12) United States Patent
Lee

(10) Patent No.: US 9,102,515 B2
(45) Date of Patent: Aug. 11, 2015

(54) NANO PATTERN FORMATION

(71) Applicant: KOREA UNIVERSITY RESEARCH AND BUSINESS FOUNDATION, Seoul (KR)

(72) Inventor: Kwangyeol Lee, Namyangju-si (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 10 days.

(21) Appl. No.: 14/054,679

(22) Filed: Oct. 15, 2013

(65) Prior Publication Data

US 2014/0044933 A1 Feb. 13, 2014

Related U.S. Application Data

(62) Division of application No. 12/507,718, filed on Jul. 22, 2009, now Pat. No. 8,563,086.

(51) Int. Cl.
*B81C 1/00* (2006.01)

(52) U.S. Cl.
CPC ......... *B81C 1/00031* (2013.01); *B81C 1/00373* (2013.01); *B81C 2201/0149* (2013.01); *B81C 2201/0191* (2013.01); *Y10T 428/24612* (2015.01); *Y10T 428/24802* (2015.01)

(58) Field of Classification Search
CPC ............................................. B81C 2201/0149
See application file for complete search history.

(56) References Cited

U.S. PATENT DOCUMENTS

| | | |
|---|---|---|
| 4,638,150 A | 1/1987 | Whitney |
| 6,541,539 B1 | 4/2003 | Yang et al. |
| 6,926,953 B2 | 8/2005 | Nealey et al. |
| 7,834,344 B2 | 11/2010 | Mascolo et al. |
| 2004/0228962 A1 | 11/2004 | Liu et al. |
| 2006/0173125 A1 | 8/2006 | Lawson et al. |
| 2006/0177952 A1 | 8/2006 | Lambertini et al. |
| 2008/0311347 A1* | 12/2008 | Millward et al. ............. 428/144 |
| 2009/0092803 A1 | 4/2009 | Bita et al. |
| 2009/0096348 A1 | 4/2009 | Liu et al. |
| 2009/0263628 A1 | 10/2009 | Millward |
| 2010/0294844 A1 | 11/2010 | Loiret-Bernal et al. |

FOREIGN PATENT DOCUMENTS

| | | |
|---|---|---|
| CN | 1692469 A | 11/2005 |
| CN | 1755938 A | 4/2006 |
| EP | 562850 A2 | 9/1993 |
| JP | H1079287 A | 3/1998 |
| JP | H11251039 A | 9/1999 |

(Continued)

OTHER PUBLICATIONS

U.S. Appl. No. 60/563,443, filed Apr. 20, 2004, Loiret-Bernal et al.

(Continued)

*Primary Examiner* — Mark Ruthkosky
*Assistant Examiner* — Ian Rummel
(74) *Attorney, Agent, or Firm* — Workman Nydegger

(57) ABSTRACT

Nano structure patterning formation includes coating a part of a structural guide with a hydrophobic polymer, positioning the structural guide on a substrate, coating at least a part of the substrate with a film made of a block copolymer, and annealing the film made of the block copolymer to align the block copolymer.

20 Claims, 6 Drawing Sheets

(56) References Cited

FOREIGN PATENT DOCUMENTS

| JP | 2003173858 A | 6/2003 |
|----|--------------|--------|
| JP | 2005002375 A | 1/2005 |
| JP | 2005190741 A | 7/2005 |
| JP | 2005191214 A | 7/2005 |
| JP | 2007272223 A | 10/2007 |
| JP | 2009094074 A | 4/2009 |
| WO | WO 2009/134635 | 11/2009 |

OTHER PUBLICATIONS

U.S. Appl. No. 60/995,505, filed Sep. 27, 2007, Bita et al.
Australian Patent Office; International Search Report and the Written Opinion in related PCT application (PCT/KR2010/004375) which claims priority to the present application; Aug. 27, 2010.
Adee, S., "Winner: The Ultimate Dielectric Is . . . Nothing," IBM packs wires in vacuum to speed chips and save power, Jan. 2008, accessed at http://www.spectrum.ieee.org/print/5811, accessed on May 1, 2013, pp. 6.
Cheng J Y, et al "Templated Self-Assembly of Block Copolymers: Top-Down Helps Bottom-up", Advanced Materials, vol. 18, Issue 19, pp. 2505-2521, Oct. 2006.
Huck & Li, Ordered Block-Copolymer Assembly Using Nanoimprint Lithography, Nano Letters, vol. 4, No. 9, p. 1633-1636, 2004.
Yang Xiao et al, "Guided Self-Assembly of Symmetric Diblock Copolymer Films on Chemically Nanopaterened Substrates" Macromolecules, 2000, 33 (26), pp. 9575-9582.
Li Hw et al "Ordered Block-Copolymer Assembly Using Nanoimprint Lithography" NanoLetters, 2004, 4 (9), pp. 163-1636.
Ricardo Ruiz, et al "Density Multiplication and Improved Lithography by Directed Block Copolymer Assembly" Science, vol. 321, Aug. 15, 2008, pp. 936-939.
Jinan Chai, et al "Assembly of aligned linear metallic patterns on silicon" Nature Nanotechnology, vol. 2, Aug. 2007, pp. 500-506.
Ion Bita, et al "Graphoepitaxy of Self-Assembled Block Copolymers on Two-Dimensional Periodic Patterned Templates" Science 321, 939 (2008).
U.S. Appl. No. 12/549,012, Jul. 17, 2012, Office Action.
U.S. Appl. No. 12/549,012, Mar. 28, 2013, Office Action.
U.S. Appl. No. 12/549,012, Jun. 19, 2013, Notice of Allowance.
Chou, S.Y. et al., "Improved nanofabrication through guided transient liquefaction," Nature Nanotechnology, vol. 3, pp. 295-300 (May 2008).
Dai, H. et al.,"Synthesis and characterization of carbide nanorods," Letters to Nature, vol. 375, pp. 769-772 (Jun. 29, 1995).
Eda, G, et al., "Large-area ultrathin films of reduced graphene oxide as a transparent and flexible electronic material," Nature Nanotechnology, vol. 3, pp. 270-274 (May 2008).
Hayamizu, Y. et al., "Integrated three-dimensional microelectromechanical devices from processable carbon nanotube wafers," Nature Nanotechnology, vol. 3, pp. 289-294 (May 2008).
International Search Report and Written Opinion in related PCT application No. PCT/KR2010/005758 mailed Dec. 6, 2010.
Kahng, D-Y. et al., "A Stretchable Form of Single-Crystal Silicon for High-Performance Electronics on Rubber Substrates," Science, vol. 311, pp. 208-212 (Jan. 13, 2006).
Kim, D-H. et al., "Stretchable and Foldable Silicon Integrated Circuits," Science, vol. 320, pp. 507-511 (Apr. 25, 2008).
Lemieux, M.C. et al.,"Self-Sorted, Aligned Nanotube Networks for Thin-Film Transistors," Science, vol. 321, pp. 101-104 (Jul. 4, 2008).
Zhang, G. et al., "Selective Etching of Metallic Carbon Nanotubes by Gas-Phase Reaction," Science, vol. 314, pp. 974-977 (Nov. 10, 2006).

* cited by examiner

NANO PATTERN FORMATION

CROSS REFERENCE TO RELATED APPLICATIONS

This application is a Divisional under 35 U.S.C. §121 of U.S. patent application Ser. No. 12/507,718 filed 22 Jul. 2009, now U.S. Pat. No. 8,563,086, the entirety of which is incorporated herein by reference.

BACKGROUND

Contemporary advances in nanotechnology have allowed several types of nano materials to become widely available for use in many different industries. The ability to measure and manipulate materials on a nanometer level now makes it possible to recognize new nano materials with enhanced properties and to thus broaden the application area of nano structures (e.g., nano wires) made with nano materials.

Nano patterns (e.g., size, shape, material types) of the nano materials on a surface of a substrate determine the surface properties of the substrate. Accordingly, surface properties (antifouling, antireflective, reflective, sticking, non-sticking, bio-compatible, etc.) can be controlled by the nano patterns on the various surfaces.

SUMMARY

Techniques for forming a nano pattern on a substrate are provided. In one embodiment, a method for forming a nano pattern on a substrate includes coating a part of a structural guide with a hydrophobic polymer, positioning the structural guide on a substrate, coating at least a part of the substrate with a film made of a block copolymer, and annealing the film made of the block copolymer to align the block copolymer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
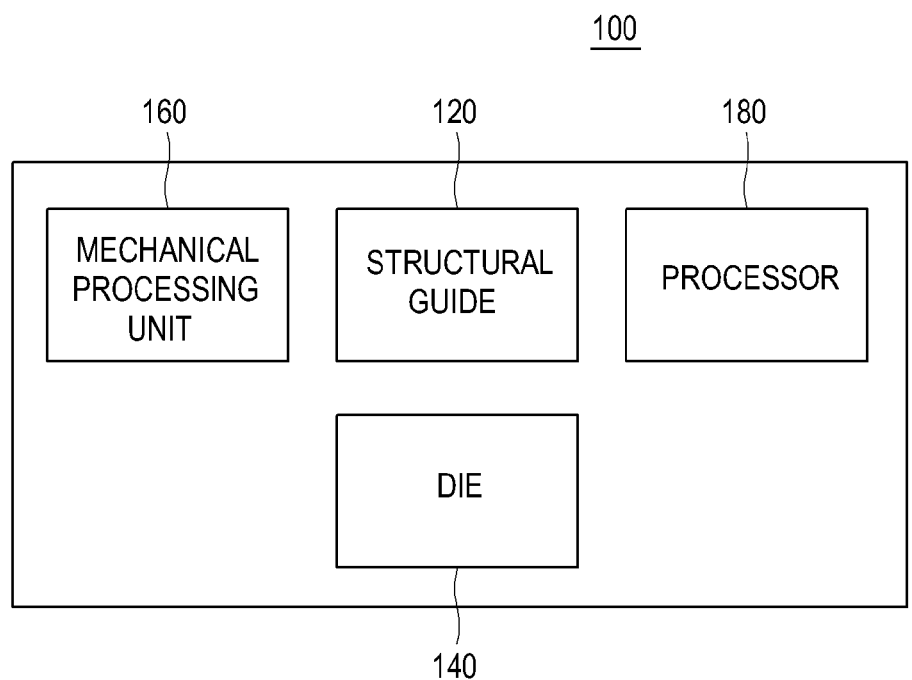
FIG. 1 is a schematic diagram of an illustrative embodiment of a nano pattern forming device.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 shows a schematic diagram of an illustrative embodiment of a nano pattern forming device 100. As depicted, nano pattern forming device 100 may include a structural guide 120, a die 140, a mechanical processing unit 160, and a processor 180. Mechanical processing unit 160 may be configured to move and position structural guide 120 and a substrate (not shown), e.g., onto a surface of die 140, to perform a processing procedure (e.g., etching, coating, annealing, etc.). For example, mechanical processing unit 160 may include a robot arm (not shown) that is configured to move structural guide 120, for example, in a vertical or a horizontal direction or other directions, and position structural guide 120 onto a surface of a substrate placed on die 140 (e.g., securing structural guide 120 onto the surface of the substrate by pressing structural guide 120 onto die 140). Mechanical processing unit 160 may include, without limitation, one or more moving units including a robot arm, a motor, a conveyer belt or combinations thereof.

Processor 180 may be configured to control the overall operations of nano pattern forming device 100. For example, processor 180 may be configured to receive input, e.g., from a user, to operate mechanical processing unit 160, and to report and/or display the operation status, e.g., for viewing by the user. Processor 180 may include microprocessors, digital signal processors (DSPs), microcontrollers, or the like. At least one system memory may be embedded in or coupled to processor 180 to store data and instructions such as software applications, including but not limited to an operating system, at least one application program, and other program modules for execution by processor 180.

Die 140 may be provided for placing a substrate (to be processed) thereupon. Die 140 may be configured to hold the substrate when structural guide 120 is placed in contact with a surface of the substrate placed on die 140 and/or when structural guide 120 is removed from and thus no longer in contact with the surface of the substrate. Die 140 may be further configured to mount the substrate on which structural guide 120 is placed to allow a process (e.g., coating, etching, or the like) to be performed upon the substrate and/or structural guide 120. Die 140 may be designed based on the size of the substrate so as to secure the substrate when structural guide 120 is placed in contact with a surface of the substrate. Structural guide 120 may also be secured to the substrate positioned on die 140. Mechanical processing unit 160 may be used to apply a predetermined amount of pressure upon structural guide 120 to secure structural guide 120 to the substrate. For example, structural guide 120 may be placed or affixed onto the surface of the substrate using mechanical processing unit 160. Affixing structural guide 120 onto the surface of the substrate may be accomplished using any of a variety of methods known to those of ordinary skill in the art and may include but not be limited to gluing, bolting, taping, adhering, etc. The amount of predetermined pressure applied onto the substrate may be proportional to, e.g., the weight of structural guide 120. Structural guide 120 may be removed from the surface of the substrate by using any of a variety of well-known processing techniques, depending on the manner that structural guide 120 is affixed onto the surface of the substrate. For example, when structural guide 120 is glued onto the surface of the substrate, the glue may be removed by immersing structural guide 120 into a solvent that can dissolve the glue, thereby allowing structural guide 120 to be removed from the surface of the substrate.

Figure 2:
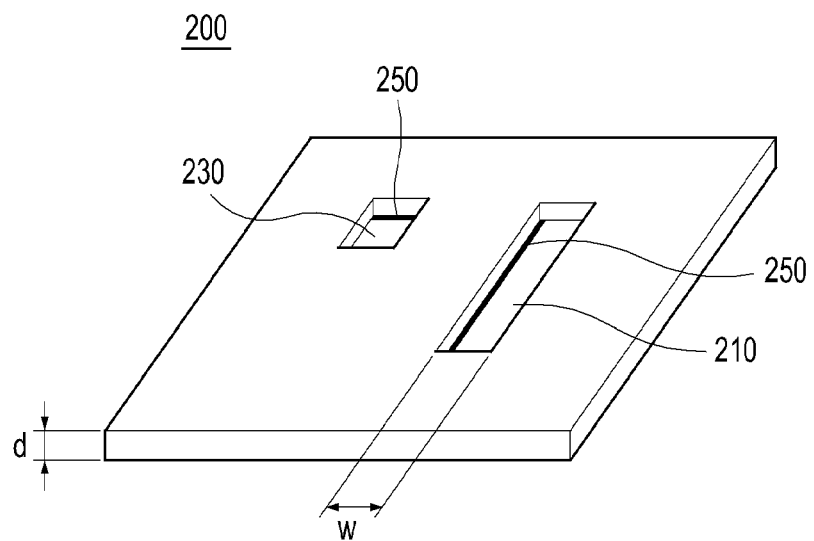
FIG. 2 shows an illustrative embodiment of a structural guide of FIG. 1 having a nano frame in the structural guide.

FIG. 2 shows an illustrative embodiment of a structural guide 200 (e.g., structural guide 120 of FIG. 1) having one or more nano frames for use in nano pattern forming device 100. Structural guide 200 may be formed to have a predetermined area substantially corresponding to or smaller than the size of a substrate that is to be placed below structural guide 200. As depicted, structural guide 200 is shown as having a predetermined depth d that can be defined according to various desired design specifications. For example, the depth d of structural guide 200 may have a value that is determined based on the dimension/scale of the nano patterns to be formed using structural guide 200. In some embodiments, the above predetermined depth d may range from about 10 nm (nanometers) to about 20 nm, from about 10 nm to about 15 nm, from about 15 nm to about 20 nm, from about 10 nm to about 100 nm, from about 15 nm to about 100 nm, or from about 100 nm to about 1000 nm. In other embodiments, the predetermined depth d may be about 10 nm, 15 nm, 20 nm, 50 nm, or 100 nm. In one embodiment, structural guide 200 may be made of any inorganic material having good electric and thermal conductivity, including but not limited to, silicagel, hydrogen silsesquioxane (HSQ), metal oxide, metal nitride, or the like.

In one embodiment, structural guide 200 may include a vertical nano frame 210 and a horizontal nano frame 230. Structural guide 200 having one or more nano frames may be manufactured using any of a variety of well-known lithography techniques. For example, some lithography techniques may include forming a resist layer made of, e.g., hydrogen silsesquioxane (HSQ), and irradiating an electron beam onto a part of the resist layer. In this way, structural guide 200 having one or more nano frames may be formed. In irradiating an electron beam, for example, one or more laser beams may be used to remove a selective part of structural guide 200 (e.g., vertical or horizontal nano frames 210 or 230) by changing the energy density and the incidence angle of the irradiated electron beams. It should be appreciated that various ranges of energy levels and properties (e.g., wavelength) of the electron beams may be used as known in the art. The scale/dimension (e.g., width w) of the nano frame may be determined according to various design specifications such as a target area within which the nano pattern is to be formed on the substrate. In one embodiment, the width w of vertical nano frame 210 may range from about 10 nm to about 20 nm, from about 10 nm to about 50 nm, from about 15 nm to about 30 nm, from about 50 nm to about 100 nm, from about 15 nm to about 70 nm, or from about 100 nm to about 500 nm. In other embodiments, the predetermined width w of vertical nano frame 210 may be about 10 nm, 20 nm, 50 nm, 100 nm, or 300 nm. Although FIG. 2 illustrates that one vertical nano frame 210 and one horizontal nano frame 230 are formed in structural guide 200, it will be appreciated that different numbers of vertical and horizontal nano frames 210 and 230 can be formed in structural guide 200. Further, the nano frames may be of various different shapes (e.g., circle, curve, etc.) depending on various design specifications for forming nano patterns.

As depicted in FIG. 2, a part of structural guide 200 may be coated with a hydrophobic polymer 250. Vertical nano frame 210 or horizontal nano frame 230 of structural guide 200 may have an edge part that extends in a vertical and horizontal direction, respectively, and which is coated with hydrophobic polymer 250. Any one of a variety of coating techniques known in the art may be used to coat hydrophobic polymer 250 onto an edge (edge part) of vertical nano frame 210 or horizontal nano frame 230. For example, a slant angle deposition may be performed to coat hydrophobic polymer 250 on a desired edge of vertical nano frame 210. Structural guide 200 may be disposed in a chamber (not shown), which then can be inclined at a predetermined angle so that the right section of structural guide 200 is lowered and the left section of structural guide 200 is elevated as desired. Hydrophobic polymer 250 may be emitted in a predetermined direction (e.g., in a horizontal direction) toward the desired edge of structural guide 200 so as to deposit hydrophobic polymer 250 into the desired edge. It should be appreciated that although FIG. 2 shows that hydrophobic polymer 250 is coated substantially in a linear line along the edge of vertical and horizontal nano frames 210 and 230, hydrophobic polymer 250 coated in vertical or horizontal nano frames 210 or 230 may have various different shapes such as a circle, a curve, etc., depending on the shape of the nano frame, the shape of the nano pattern that is to be formed, or the like.

In some embodiments, a dummy substrate (not shown) may be provided below structural guide 200 to facilitate the coating of hydrophobic polymer 250. The dummy substrate may be in contact with structural guide 200. Processor 180 may be configured to coat a layer of hydrophobic polymers on portions of the dummy substrate exposed through vertical or horizontal nano frames 210 and 230. In other embodiments the entire dummy layer or the entire dummy layer exposed through vertical or horizontal nano frames 210 and 230 may be coated with hydrophobic polymers. Structural guide 200 located on the dummy substrate may be placed in a chamber (not shown), which can then be inclined at a predetermined angle. Undesired portions of hydrophobic polymer 250 may then be removed using various etching techniques including, but not limited to, e-beam radiation, oxygen reactive ion etching (RIE) or the like. In some embodiments, the undesired part of the hydrophobic polymers may be selectively removed, thereby leaving hydrophobic polymers coated on a desired edge of vertical or horizontal nano frames 210 and 230. The dummy substrate may be detached and removed from structural guide 200.

As used herein, the term "hydrophobic polymer" refers to any polymer that is resistant to wetting, or not readily wet, by water, i.e., having a lack of affinity for water. Examples of hydrophobic polymers may include, by way of illustration polyolefins such as polyethylene, poly(isobutene), poly(isoprene), poly(4-methyl-1-pentene), polypropylene, ethylene-propylene copolymers, ethylene-propylene-hexadiene copolymers, or ethylene-vinyl acetate copolymers; metallocene polyolefins such as ethylene-butene copolymers or ethylene-octene copolymers; styrene polymers such as poly (styrene), poly(2-methylstyrene), or styrene-acrylonitrile copolymers having less than about 20 mole-percent acrylonitrile; vinyl polymers such as poly(vinyl butyrate), poly(vinyl decanoate), poly(vinyl dodecanoate), poly(vinyl hexadecanoate), poly(vinyl hexanoate), poly(vinyl octanoate), or poly(methacrylonitrile); acrylic polymers such as poly(n-butyl acetate), or poly(ethyl acrylate); methacrylic polymers such as poly(benzyl methacrylate), poly(n-butyl methacrylate), poly(isobutyl methacrylate), poly(t-butyl methacrylate), poly(t-butylaminoethyl methacrylate), poly(do-decyl methacrylate), poly(ethyl methacrylate), poly(2-ethylhexyl methacrylate), poly(n-hexyl methacrylate), poly(phenyl methacrylate), poly(n-propyl methacrylate), or poly(octadecyl methacrylate); polyesters such as poly(ethylene terephthalate) or poly(butylene terephthalate); or polyalkenes or polyalkynes such as polybutylene or polyacetylene. The term "polyolefin" as used herein refers to a polymer prepared by addition polymerization, which, as is generally known in the art, is a polymerization technique where one or more unsaturated monomers add on to a growing polymer chain one at a time. Examples of such polyolefins include polyethylene, polypropylene, poly(1-butene), poly(2-butene), poly(1-pentene), poly(2-pentene), poly(3-methyl-1-pentene), poly(4-methyl-1-pentene), or the like. In addition, polyolefin also includes blends of two or more polyolefins and random or block copolymers prepared from two or more different unsaturated monomers. Examples of two desired polyolefins are polyethylene and polypropylene.

Figure 3:
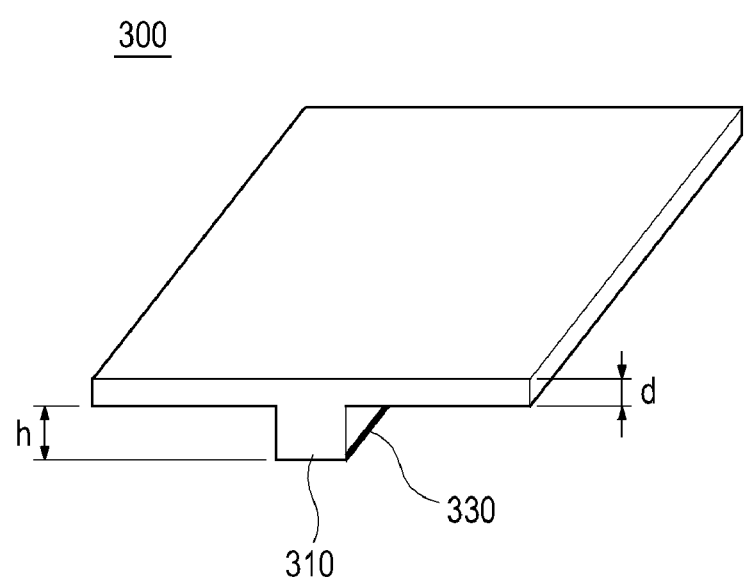
FIG. 3 shows an illustrative embodiment of the structural guide of FIG. 1 having a protruded nano beam in the structural guide.

FIG. 3 shows an illustrative embodiment of a structural guide 300 (e.g., structural guide 120 of FIG. 1) having a protruded nano beam 310 for use in nano pattern forming device 100. Structural guide 300 may be formed to have a predetermined area substantially corresponding to or smaller than the size of a substrate that is to be placed below structural guide 300. As depicted, structural guide 300 having nano beam 310 may have a predetermined depth d that is substantially identical to the depth of structural guide 200 described above. In one embodiment, structural guide 300 may be made of any inorganic material having good electric and thermal conductivity such as silicagel, hydrogen silsesquioxane (HSQ), metal oxide, metal nitride or the like.

As depicted in FIG. 3, structural guide 300 may include protruded nano beam 310 on a bottom surface thereof. In one embodiment, structural guide 300 having one or more protruded nano beams 310 may be manufactured using any of a variety of well-known lithography techniques in a manner substantially similar to that described above with reference to structural guide 200. For example, the lithography techniques may include forming a resist layer made of, e.g., HSQ, and irradiating an electron beam onto a part of the resist layer to remove that part of the resist layer, thereby forming structural guide 300 having one or more protruded nano beams 310. Protruded nano beam 310 may be designed to have a height h that is defined according to various desired design specifications such as the depth of a film of block copolymer that is to be aligned on the substrate. In one embodiment, the height h of protruded nano beam 310 may range from about 10 nm to about 30 nm, from about 20 nm to about 50 nm, from about 15 nm to about 70 nm, from about 50 nm to about 100 nm, from about 20 nm to about 100 nm, or from about 100 nm to about 500 nm. In other embodiments, the predetermined height h of protruded nano beam 310 may be about 10 nm, 50 nm, 100 nm, 200 nm, or 300 nm. Although FIG. 3 illustrates that one protruded nano beam 310 is formed on structural guide 300, it will be appreciated that a different number of protruded nano beams 310 can be formed on structural guide 300. Further, protruded nano beams 310 may be of various shapes (e.g., circle, curve, etc.) depending on various design specifications for forming nano patterns. A part of structural guide 300 may be coated with a hydrophobic polymer 330. Protruded nano beam 310 of structural guide 300 may have an edge part that is coated with hydrophobic polymer 330 by using any of a variety of coating techniques known in the art. For example, a slant angle deposition may be performed on a desired edge of protruded nano beam 310 to coat hydrophobic polymer 330 on the desired edge in a manner substantially similar to that described above with reference to nano frames of structural guide 200. Alternatively, a layer of hydrophobic polymers may be coated on a part of or on the entire surface of protruded nano beam 310. Undesired portions of the hydrophobic polymers may then be removed using various etching techniques, thereby leaving hydrophobic polymers coated on a desired edge of protruded nano beam 310.

Figure 4:
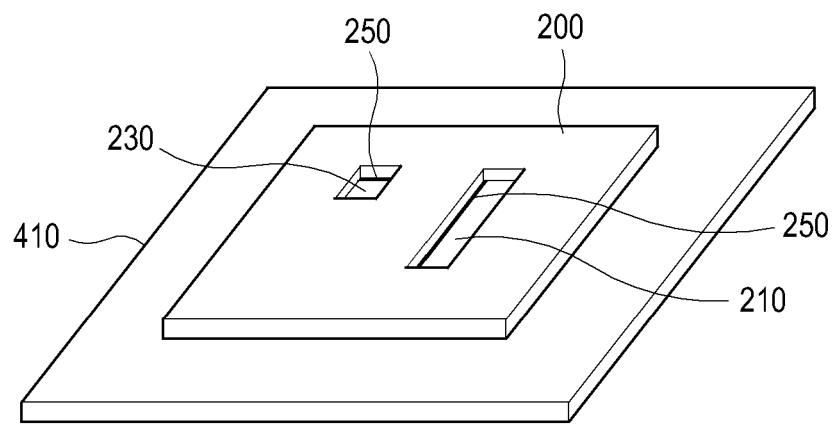
FIG. 4 shows a perspective view of the structural guide with the nano frame of FIG. 2 positioned on a substrate.

FIG. 4 shows a perspective view of a structural guide with a nano frame (e.g., structural guide 200 having vertical and horizontal nano frames 210 and 230) positioned on a substrate 410. Substrate 410 may be made of any semiconductor substrate including, but not limited to, Silicon (Si), Gallium Arsenide (GaAs), Silicon-On-Insulator (SOI), GaAs/AlAs/SiGaAs, AlGaN/GaN/Si, or the like. Alternatively, substrate 410 may include a non-semiconductor based substrate 410 that is selected based on the properties of the substrate material (e.g., flexibility, dimension, cost, durability, etc.). Structural guide 200 may be placed in a chamber (not shown) and positioned onto die 140 under the control of mechanical processing unit 160 to place structural guide 200 in contact with a surface of substrate 410 disposed on die 140. Structural guide 200 may be affixed onto an upper surface of substrate 410 using mechanical processing unit 160, e.g., by applying glue or an adhesive on the bottom surface of structural guide 200. In some embodiments, a pressing unit (not shown) may be configured to apply and control a predetermined amount of pressure upon structural guide 200 to assist in affixing structural guide 200 onto an upper surface of substrate 410. Affixing structural guide 200 onto the surface of substrate 410 may also be accomplished using other methods known to those of ordinary skill in the art and may include but not be limited to bolting, taping, adhering, etc. Securing structural guide 200 on substrate 410 may allow a part of structural guide 200, other than parts of vertical and horizontal nano frames 210 and 230, to contact the surface of substrate 410, while exposing parts of the surface of substrate 410 through vertical and horizontal nano frames 210 and 230.

In one embodiment, processor 180 may be configured to control the operation of coating a film of block copolymer onto at least a part of the surface of substrate 410 that is exposed through vertical and horizontal nano frames 210 and 230 of structural guide 200 placed on substrate 410. A block copolymer is made up of blocks of different polymerized monomers and may include various types of polymerized monomers including, but not limited to, polystyreneblock-poly(2-vinylpyridine) (PS-b-P2VP), polystyrene-b-polydimethylsiloxane (PS-b-PDMS), polystyrene-b-poly(methyl methacrylate) (PS-b-PMMA), or the like. Block copolymers may be made using any of a variety of known techniques such as atom transfer free radical polymerization (ATRP), reversible addition fragmentation chain transfer (RAFT), ring-opening metathesis polymerization (ROMP), or living cationic or living anionic polymerizations. In the coating process, substrate 410 having structural guide 200 thereon may be disposed in a chamber (not shown), and a film of block copolymer may be selectively deposited on the surface of substrate 410 that is exposed through vertical and horizontal nano frames 210 and 230 using any of a variety of coating techniques known in the art. For example, a spin-coating may be performed using toluene solution of PS-b-P2VP on the exposed surface of substrate 410 within vertical and horizontal nano frames 210 and 230, thereby coating the PS-b-P2VP block copolymer selectively on the exposed surface of substrate 410. The film of block copolymer (e.g., PS-b-P2VP) coated on the surface of substrate 410 may have a depth ranging from about 5 nm to about 20 nm, from about 10 nm to about 30 nm, from about 15 nm to about 50 nm, or from about 30 nm to about 100 nm.

Processor 180 may be further configured to control the operation of annealing the film of block copolymer coated on the surface of substrate 410. In the annealing process, substrate 410 with a part of its surface coated with the film of block copolymer may be disposed in a chamber (not shown). A heater (not shown) may then apply heat to the surface of substrate 410 (that is coated with the film of block copolymer) using any of a variety of annealing techniques well-known in the art. In one embodiment, the annealing process may continue for a predetermined time (e.g., 24 hours) at an elevated temperature (e.g., 200° C.), depending on various factors such as the type of block copolymer used, the depth of the film of the block copolymer, etc. The heating operation may facilitate an interaction between a hydrophobic block in the film of the block copolymer with hydrophobic polymer 250, which is coated on the edge part of vertical and horizontal nano frames 210 and 230. Such interaction causes the hydrophobic block of the block copolymer to be aligned on an edge part of vertical and horizontal nano frames 210 and 230.

Figure 5:
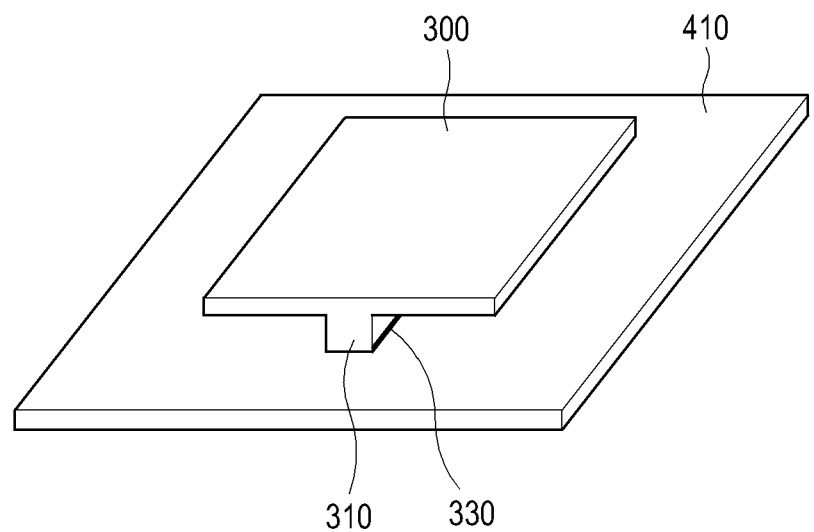
FIG. 5 shows a perspective view of the structural guide with the protruded nano beam of FIG. 3 positioned on a substrate.

FIG. 5 shows a perspective view of a structural guide with a protruded nano beam (e.g., structural guide 300 with protruded nano beam 310 of FIG. 3) positioned on substrate 410. As described above, substrate 410 may be of various types of materials such as SI, GaAs, or the like. Structural guide 300 may be placed in a chamber (not shown) and positioned onto die 140 using mechanical processing unit 160. In some embodiments, protruded portion 310 is positioned to be in contact with a surface of substrate 410 disposed on die 140. Protruded portion 310 may be affixed on the surface of substrate 410, e.g., by applying a glue or adhesive on a bottom surface of protruded portion 310 of structural guide 300. Affixing protruded portion 310 onto the surface of the substrate 410 may also be accomplished using other methods known to those of ordinary skill in the art and may include but not be limited to bolting, taping, adhering etc.

In one embodiment, processor 180 may be configured to control the operation of coating a film of block copolymer onto at least a part of the surface of substrate 410 that does not contact the bottom surface of protruded portion 310. As described above, various kinds of block copolymers such as PS-b-P2VP, PS-b-PDMS, PS-b-PMMA, or the like, may be used depending on design/implementation requirements. In the coating process, substrate 410 having structural guide 300 thereon may be disposed in a chamber (not shown). A film of block copolymer may then be selectively deposited on the surface of substrate 410 by using any of a variety of coating techniques known in the art (e.g., spin coating). The film of block copolymer coated on the surface of substrate 410 may have a depth ranging from about 5 nm to about 20 nm, from about 10 nm to about 30 nm, from about 15 nm to about 50 nm, or from about 30 nm to about 100 nm. Processor 180 may be further configured to control the operation of annealing the film of block copolymer that is coated on the surface of substrate 410. In the annealing process, as described above, substrate 410 (with a part of its surface coated with the film of block copolymer) may be disposed in a chamber (not shown). The film of block copolymer coating the surface of substrate 410 is then heated. Heating of the film of block copolymer may be done through an annealing operation facilitating an interaction between a hydrophobic block in the film of block copolymer and hydrophobic polymer 330. Such interaction causes the hydrophobic block to be aligned on the surface of substrate 410 according to the shape (e.g., line) of hydrophobic polymer 330 coated on protruded nano beam 310 of structural guide 300.

Figure 6:
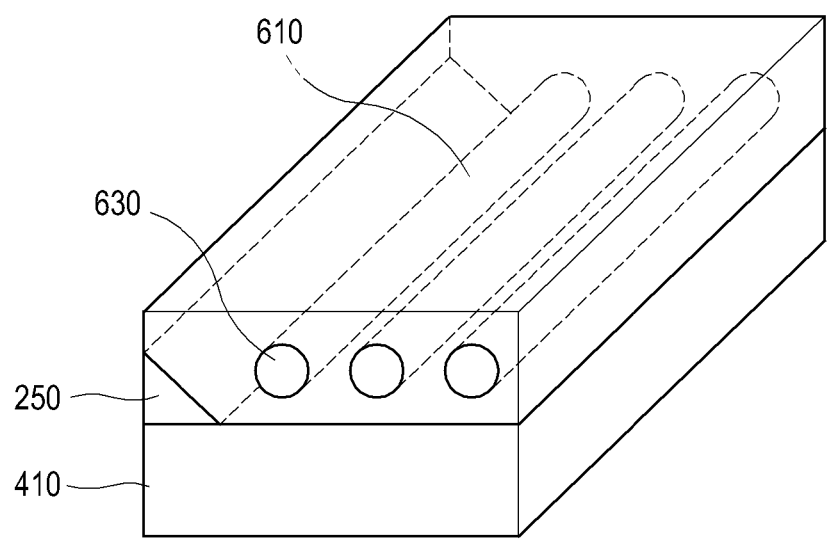
FIG. 6 shows a perspective view of a film of the block co-polymer aligned on the substrate with an edge part of the nano frame of FIG. 4 coated with a hydrophobic polymer.

FIG. 6 shows a perspective view of a film of block copolymer coated and aligned in a nano frame (e.g., vertical and horizontal nano frames 210 and 230 of FIG. 4) on substrate 410. As depicted, the film of block copolymer having a hydrophilic block 610 and hydrophobic blocks 630 is coated on the surface of substrate 410 with hydrophobic polymer 250 coated on a part (e.g., edge part) of a nano frame (e.g., vertical nano frame 210 of FIG. 2). Through chemical interaction between hydrophobic polymer 250 and hydrophobic blocks 630, hydrophobic polymer 250 may serve as a guide to allow hydrophobic blocks 630 to align in a direction where hydrophobic polymer 250 extends (e.g., a vertical direction in this case). Hydrophobic blocks 630 may be aligned to have a predetermined center-to-center spacing between two adjacent hydrophobic blocks 630. In some embodiments, the above predetermined center-to-center spacing may range from about 10 nm to about 30 nm, from about 15 nm to about 35 nm, from about 20 nm to about 40 nm, from about 25 nm to about 50 nm, from about 15 nm to about 50 nm, or from about 30 nm to about 100 nm. In one embodiment, processor 180 may be configured to remove at least a part of the film of block copolymer from the surface of substrate 410. Substrate 410 (having the film of block copolymer coated thereon) may be placed in a chamber (not shown) and positioned onto die 140 using mechanical processing unit 160. The film of block copolymer may then be etched using various different etching techniques including, but not limited to an oxygen plasma treatment (e.g., oxygen reactive ion etching: RIE). In this way, hydrophilic block 610 of the film of block copolymer may be selectively removed, thereby leaving a fine line of hydrophobic blocks 630 on the surface of substrate 410. Although FIG. 6 illustrates the film of block copolymer coated in a nano frame, it is appreciated that the film of block copolymer can be coated onto and partly removed from the surface of a substrate (e.g., substrate 410 of FIG. 4) in a manner similar to that described above.

Figure 7:
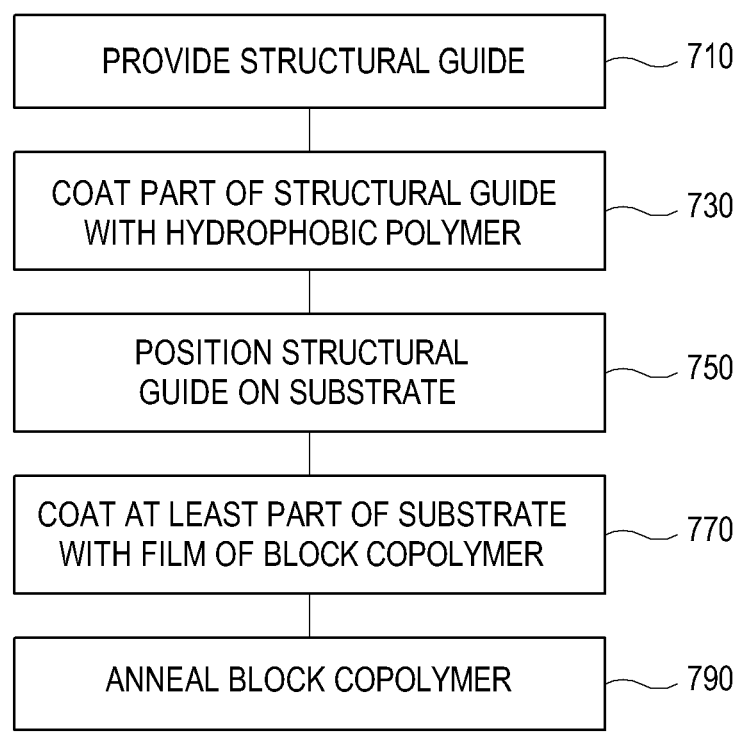
FIG. 7 shows a flow diagram of an illustrative embodiment of a method for forming a nano pattern of the block co-polymer aligned on a substrate.

FIG. 7 shows a flow diagram of an illustrative embodiment of a method for forming a nano pattern of block copolymer aligned on a substrate. In block 710, a structural guide, such as structural guide 120, is provided and placed on the substrate. The structural guide may be formed to have a predetermined area substantially corresponding to or smaller than the size of the substrate. As depicted in FIGS. 2 and 3, the structural guide may have a predetermined depth d that can be defined according to various desired design specifications. The structural guide may be made of any inorganic material having good electric and thermal conductivity, for example, silicagel, HSQ, metal oxide, metal nitride, or the like. In one embodiment, the structural guide may include a vertical nano frame and a horizontal nano frame, similar to structural guide 200 of FIG. 2. The structural guide having one or more nano frames may be manufactured using any of a variety of aforementioned well-known lithography techniques. The scale/dimension (e.g., width w) of the nano frame may be determined according to various design specification such as areas within which the nano pattern is to be formed. In other embodiments, the structural guide may be configured to have one or more protruding nano beams, similar to structural guide 300 of FIG. 3, and may be manufactured using any of a variety of aforementioned well-known lithography techniques. The scale/dimension (e.g., height h) of the nano frame may be determined according to various design specifications. In one embodiment, the scale/dimension may be determined based on the area within which the nano pattern is to be formed.

In block 730, a part of the structural guide may be coated with a hydrophobic polymer using any of a variety of coating techniques known in the art. In one embodiment, in the case of a structural guide similar to the structural guide illustrated in FIG. 2, an edge part of vertical and horizontal nano frames of the structural guide may be coated with the hydrophobic polymer. For example, a slant angle deposition may be performed to coat the hydrophobic polymer on a desired edge of the vertical nano frame. The structural guide may be disposed in a chamber (not shown), which can then be inclined at a predetermined angle. In some embodiments, the left section of the structural guide may be elevated above the right section as desired. The hydrophobic polymer may then be emitted in a predetermined direction (e.g., in a horizontal direction) toward the desired edge of the vertical and horizontal nano frames of the structural guide so as to deposit the hydrophobic polymer onto the desired edge. Alternatively, a dummy substrate (not shown) may be provided below the structural guide. In some embodiments the dummy substrate will be in contact with the structural guide. A layer of hydrophobic polymers may be coated on portions of the dummy substrate that are exposed through the vertical or horizontal nano frames. In other embodiments the entire dummy substrate or the portions of the dummy substrate that are exposed through the vertical or horizontal nano frames are coated with hydrophobic polymers. The structural guide which is located on the dummy substrate may be placed in a chamber (not shown), which can then be inclined at a predetermined angle. Undesired portions of the hydrophobic polymers may then be removed using various etching techniques including, but not limited to e-beam radiation, oxygen reactive ion etching (RIE) or the like. In some instances, the undesired portions of the hydrophobic polymers may be selectively removed, thereby leaving hydrophobic polymers coated on a desired edge of the vertical or horizontal nano frames. The dummy substrate may be detached and removed from structural guide 200. In another embodiment, in the case of a structural guide similar to the structural guide illustrated in FIG. 3, a part of the structural guide, such as an edge of a protruded beam of the structural guide, may be coated with the hydrophobic polymer. For example, a slant angle deposition may be performed on a desired edge of the protruded nano beam, in a manner substantially similar to that described above, to coat the hydrophobic polymer on the desired edge. Alternatively, a layer of hydrophobic polymers may be coated on a part of or on the entire surface of the protruded nano beam. Undesired portions of the hydrophobic polymers may then be removed using various etching techniques, thereby leaving hydrophobic polymers coated on a desired edge of the protruded nano beam.

In block 750, the structural guide is positioned on the substrate. In some embodiments, at least a part of the structural guide may be in contact and/or secured onto a surface of the substrate. The structural guide may be placed in a chamber (not shown) and positioned onto a die, such as die 140, by a mechanical processing unit, such as mechanical processing unit 160. In some embodiments, the structural guide may be in contact with a surface of the substrate disposed on the die. A pressing unit (not shown) may be configured to apply and control a predetermined amount of pressure upon the structural guide placed on a surface of the substrate. The pressing unit may facilitate the affixing of the structural guide onto an upper surface of the substrate, e.g., by applying glue or an adhesive on the bottom surface of the structural guide that is to be placed on the upper surface of the substrate. In one embodiment, in the case of a structural guide similar to the structural guide illustrated in FIG. 2, securing the structural guide on the substrate may allow a part of the structural guide other than parts of the vertical and horizontal nano frames to contact the surface of the substrate, while exposing parts of the surface of the substrate through the vertical and horizontal nano frames. In another embodiment, in the case of a structural guide similar to the structural guide illustrated in FIG. 3, a protruded portion of the structural guide may be affixed on the surface of the substrate, e.g., by applying glue or adhesive on a bottom surface of the protruded portion of the structural guide, or by bolting the protruded portion of the structural guide to the substrate.

In block 770, at least a part of the substrate is coated with a film of block copolymer. In one embodiment, a processor, such as processor 180, may be configured to control the operation of coating a film of block copolymer onto at least a part of the surface of the substrate that is exposed through vertical and horizontal nano frames of the structural guide. As described above, various kinds of block copolymers such as PS-b-P2VP, PS-b-PDMS, PS-b-PMMA, or the like, may be used. In the case of a structural guide similar to the structural guide illustrated in FIG. 2, the coating process may involve placing the substrate having the structural guide thereon into a chamber (not shown). A film of block copolymer may then be selectively deposited on the surface of the substrate that is exposed through the vertical and horizontal nano frames using any of a variety of aforementioned coating techniques known in the art. For example, spin-coating may be performed using a toluene solution of PS-b-P2VP on the exposed surface of the substrate. The spin coating may be performed within the vertical and horizontal nano frames, thereby coating the PS-b-P2VP block copolymer on the exposed surfaces of the substrate. The film of block copolymer coated on the surface of the substrate may have a depth ranging from about 5 nm to about 20 nm, from about 10 nm to about 30 nm, from about 15 nm to about 50 nm, or from about 30 nm to about 100 nm. In the case of a structural guide similar to the structural guide illustrated in FIG. 3, the coating process may involve placing the substrate having the structural guide thereon into a chamber (not shown) and selectively depositing a film of block copolymer on the surface of the substrate using any of a variety of coating techniques known in the art, in a manner similar to that described above.

In block 790, the block copolymer that is coated on the part of the substrate is annealed. In the annealing process, a processor, such as processor 180, may be configured to control the annealing of the film of block copolymer. By way of example, after a part of the substrate having the structural guide thereon is placed in a chamber and is coated with a block of copolymer as described above, a heater (not shown) may apply heat to the surface of the substrate that is coated with the film of block copolymer. The heat may be applied using any of a variety of annealing techniques known in the art. The annealing process may continue for a predetermined time (e.g., 24 hours) at an elevated temperature (e.g., 200° C.), depending on various factors such as the kind of block copolymer, the depth of the film of the block copolymer, etc. In this way, the heating operation facilitates an interaction between the hydrophobic blocks, such as hydrophobic blocks 630. Such interaction causes the block copolymer to be aligned in vertical and horizontal nano frames according to the shape (e.g., line) of the hydrophobic polymer. In a similar fashion, in other embodiments, hydrophobic blocks 630 included in the film of block copolymer may interact with hydrophobic polymer 330 coated on the edge part of protruded nano beam 310 (FIG. 3) so that the block copolymer may be aligned on the surface of substrate 410.

Further, processor 180 may be configured to control the removal of at least a part of the film of block copolymer from the surface of the substrate using any of a variety of well-known etching techniques. By way of example the substrate having the film of block copolymer coated thereon may be placed in a chamber (not shown) and positioned onto a die, such as die 140, using a mechanical processing unit, such as mechanical processing unit 160. An oxygen plasma treatment (e.g., oxygen reactive ion etching: RIE) may then be performed on the film of the block copolymer to thereby remove at least a part of the film of the block copolymer. In this way, the hydrophilic block of the film of block copolymer may be selectively removed, thereby leaving a fine line of hydrophobic blocks.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 8:
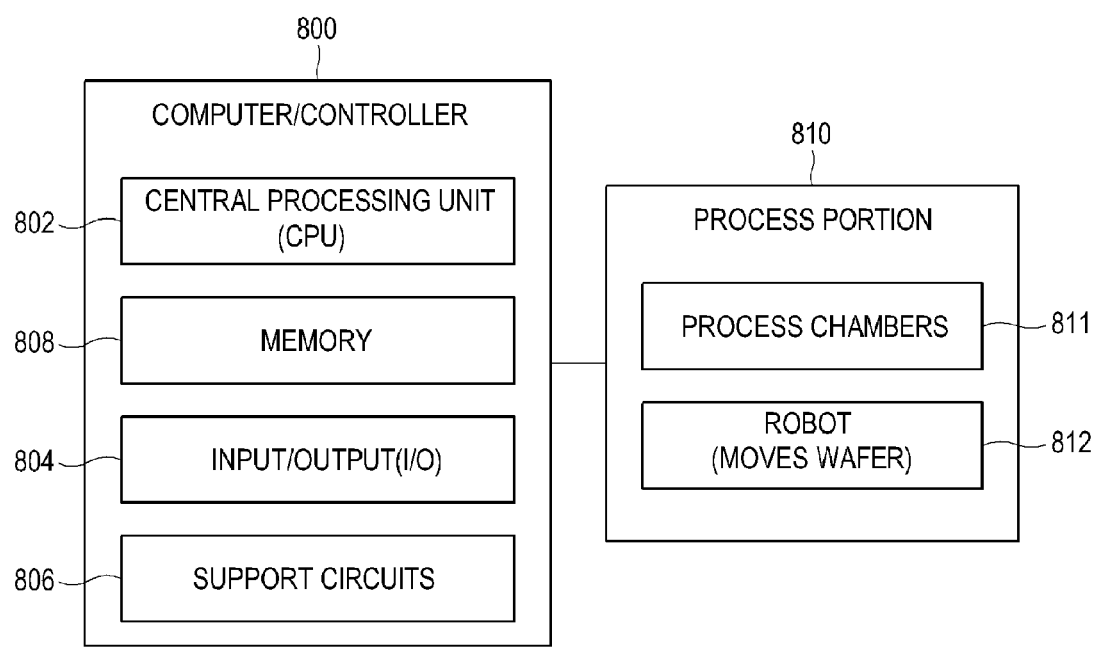
FIG. 8 shows a block diagram of an illustrative embodiment of a computer/controller suitable to control the operations of the method illustrated in FIG. 7.

FIG. 8 shows a block diagram of an illustrative embodiment of a computer or a controller suitable to control the operations of the process illustrated in FIG. 9. As depicted, a controller/computer 800 is coupled to a process portion ("fab") 810. Process portion 810 includes a variety of process chambers 811 between which the substrate 410 is processed using a robot mechanism 812 to move a wafer. The processing varies according to the depth/width of materials that are deposited and then etched, the pattern being imprinted and then etched using the above-described method. Such processes include chemical vapor deposition, physical vapor deposition, electro-chemical deposition, and reactive ion etching (RIE), which are known for depositing and/or etching specific materials within process portion 810. Controller/computer 800 includes a central processing unit (CPU) 802, a memory 808, support circuits 806, and input/output (I/O) circuits 804. CPU 802 may be a general purpose computer that, when programmed by executing software contained in memory 808, becomes a specific purpose computer for controlling the hardware components of process portion 810. Memory 808 may include Read-Only-Memory (ROM), Random Access Memory (RAM), removable storage, a hard disk drive, or any form of digital memory device. I/O circuits 804 may include well-known displays for the output of information while a keyboard, mouse, track ball, or other input device can allow for programming of controller/computer 800 to determine the processes performed by process portion 810 (including the associated robot action included in process portion 810). Support circuits 806 are well-known in the art and include circuits such as caches, clocks, power supplies, or the like. Memory 808 contains control software that, when executed by CPU 802, enables controller/computer 800 to digitally control the various components of process portion 810. In another embodiment, computer/controller 800 may be analog. For instance, application specific integrated circuits are capable of controlling processes such as those which occur within process portion 810.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," or the like include the number recited and refer to ranges which can be subsequently broken down into subranges as discussed above.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A device comprising:
a substrate, at least a part of the substrate coated with a film comprising a block copolymer which is at least partially annealed and at least a portion of the block copolymer is removed after annealing,
wherein the block copolymer includes:
at least one hydrophobic block; and
at least one hydrophilic block, and
wherein the portion removed is at least a part of the at least one hydrophilic block of the film, leaving at least a part of the at least one hydrophobic block polymer on the substrate; and
a structural guide on the substrate, the structural guide being removably affixed to the substrate, a part of the structural guide being coated with a hydrophobic polymer, wherein the hydrophobic polymer interacts with the hydrophobic block such that the hydrophobic block is aligned according to a shape of the hydrophobic polymer on the part of the structural guide, so that the hydrophobic block is oriented in a same direction relative to the shape of the hydrophobic polymer,
wherein the structural guide comprises one of a nano frame formed in the structural guide or a protruded nano beam formed on the structural guide.

2. The device of claim 1, wherein the structural guide comprises a nano frame formed in the structural guide.

3. The device of claim 1, wherein the structural guide comprises a protruded nano beam formed on the structural guide.

4. The device of claim 2, wherein a part of the structural guide coated with a hydrophobic polymer comprises an edge part of the nano frame.

5. The device of claim 3, wherein a part of the structural guide coated with the hydrophobic polymer comprises an edge part of the protruded nano beam.

6. The device of claim 1, wherein the structural guide is coated with the hydrophobic polymer using slant angle deposition.

7. The device of claim 1, wherein a surface of the substrate exposed through the frame is coated with the film comprising the block copolymer.

8. The device of claim 1, wherein a surface of the substrate is coated with the film of the block copolymer.

9. The device of claim 1, wherein the portion of the film corresponding to a hydrophobic block of the block copolymer is partially removed.

10. A device comprising:
a substrate, at least a part of the substrate coated with a film comprising a block copolymer which is at least partially annealed and at least a portion of the block copolymer is removed after annealing,
wherein the block copolymer includes:
at least one hydrophobic block; and
at least one hydrophilic block, and
wherein the portion removed is at least a part of the at least one hydrophilic block of the film, leaving at least a part of the at least one hydrophobic block polymer on the substrate; and
a structural guide disposed against a first surface of the substrate, only a single edge portion of the structural guide being coated with a hydrophobic polymer coating, the hydrophobic polymer coating on the edge portion having a shape, wherein the hydrophobic polymer coating interacts with the hydrophobic block such that the hydrophobic block of the block copolymer is aligned according to the shape of the hydrophobic polymer coating on the edge portion of the structural guide, so that the hydrophobic block is oriented in a same direction relative to the shape of the hydrophobic polymer;
wherein the structural guide comprises one of a nano frame formed in the structural guide or a nano beam protrusion formed on a second surface of the structural guide, the nano beam protrusion extending towards the substrate, so that the nano beam protrusion is sandwiched between the substrate and a remainder of the structural guide.

11. The device of claim 1, wherein the part of the structural guide that is coated with the hydrophobic polymer is only an edge portion of the structural guide such that only the edge portion of the structural guide is coated with the hydrophobic polymer.

12. The device of claim 11, wherein the edge portion is inclined relative to a first surface of the substrate.

13. The device of claim 10, wherein the structural guide is removably affixed to the substrate.

14. The device of claim 10, wherein the edge portion is inclined relative to the first surface of the substrate.

15. The device of claim 10, wherein the hydrophobic block that is aligned according to the shape of the hydrophobic polymer coating is congruent with an edge profile of the hydrophobic polymer coating.

16. The device of claim 1, wherein the hydrophobic block that is aligned according to the shape of the hydrophobic polymer coating is congruent with an edge profile of the hydrophobic polymer coating.

17. The device of claim 10, wherein the coated edge portion is linear so that the hydrophobic block that is aligned according to the shape of the hydrophobic polymer coating is also linear.

18. The device of claim 1, wherein the coated edge portion is linear so that the hydrophobic block that is aligned according to the shape of the hydrophobic polymer coating is also linear.

19. The device of claim 1, wherein an area of the structural guide substantially corresponds to an area of the substrate.

20. The device of claim 10, wherein an area of the structural guide substantially corresponds to an area of the first surface of the substrate.

* * * * *